(12) United States Patent
Ji et al.

(10) Patent No.: US 12,581,613 B2
(45) Date of Patent: Mar. 17, 2026

(54) APPARATUS OF IMPROVING DURABILITY BASED ON DEHUMIDIFICATION DEVICE

(71) Applicant: UA SUN CO., LTD., Gimcheon-si (KR)

(72) Inventors: Yong Joo Ji, Gimcheon-si (KR); Ho Kyung Lee, Yongin-si (KR); Jun Hyuk Oh, Gimcheon-si (KR)

(73) Assignee: UA SUN CO., LTD., Gimcheon-si (KR)

(*) Notice: Subject to any disclaimer, the term of this patent is extended or adjusted under 35 U.S.C. 154(b) by 152 days.

(21) Appl. No.: 18/567,582

(22) PCT Filed: Dec. 1, 2023

(86) PCT No.: PCT/KR2023/019683
§ 371 (c)(1),
(2) Date: Dec. 6, 2023

(87) PCT Pub. No.: WO2025/116094
PCT Pub. Date: Jun. 5, 2025

(65) Prior Publication Data
US 2025/0185202 A1 Jun. 5, 2025

(51) Int. Cl.
*H05K 7/20* (2006.01)
*B01D 53/26* (2006.01)
*B01D 53/32* (2006.01)

(52) U.S. Cl.
CPC ......... *H05K 7/20145* (2013.01); *B01D 53/26* (2013.01); *B01D 53/326* (2013.01); *B01D 2257/80* (2013.01)

(58) Field of Classification Search
CPC .......... F25D 17/045; F25D 17/06; G06F 1/20; H05K 7/20163; H05K 7/20172;
(Continued)

(56) References Cited

U.S. PATENT DOCUMENTS 5,832,988 A * 11/1998 Mistry .................. H05K 7/206
                                                   165/104.34
6,104,003 A * 8/2000 Jones ..................... H05K 7/207
                                                   219/400
(Continued)

FOREIGN PATENT DOCUMENTS

KR       10-1717619 B1    3/2017

OTHER PUBLICATIONS

Karppanen et al., Electric information board, WO2007116116;
PE2E search (Year: 2007).*

*Primary Examiner* — Michael A Matey
(74) *Attorney, Agent, or Firm* — Bridgeway IP Law Group, PLLC; Sang Ho Lee; Hyun Woo Shin

(57) ABSTRACT

The present disclosure relates to an apparatus for protecting electronic equipment that is used in an interior sealed space, in which electronic equipment is installed, to prevent the temperature of the interior sealed space from increasing higher than external air due to heat generated by the electronic equipment positioned therein and to prevent humidity from being produced in the interior sealed space, the apparatus including: a housing (100) disposed on a wall of the interior sealed space; an external air channel forming unit (200) that suctions external air, which has temperature lower than temperature of the interior sealed space, from a side of a lower portion of a first surface (110) of the housing using a first fan disposed at an upper portion of the housing, sends upward the external air, and discharges the external air to a side of an upper portion of the first surface of the housing; and internal channel forming unit (300) that suctions internal air at a relatively high temperature in the interior closed space using a second fan and a third fan respectively disposed on a second surface (120) and a third surface (130) adjacent to the first surface of the housing such that the internal air suctioned through the second fan and the internal (Continued)

air suctioned through the third fan partially overlap the external air channel and hit against each other and the internal air descends and is then discharged from a lower portion of the second surface and a lower portion of the third surface of the housing.

5 Claims, 13 Drawing Sheets

(58) Field of Classification Search
CPC .......... H05K 7/20736; H05K 7/20745; H05K 7/20145; H05K 7/202; H05K 7/206; B01D 53/26; B01D 53/326; B01D 2257/80
See application file for complete search history.

(56) References Cited

U.S. PATENT DOCUMENTS

| | | | | |
|---|---|---|---|---|
| 6,612,365 | B1 * | 9/2003 | Saishu | H05K 7/206 165/47 |
| 8,221,523 | B2 * | 7/2012 | Orava | F24F 3/1411 96/108 |
| 2003/0094266 | A1 * | 5/2003 | Fritsch | H05K 7/206 165/104.34 |
| 2004/0007347 | A1 * | 1/2004 | Stoller | H05K 7/206 165/47 |
| 2009/0101304 | A1 * | 4/2009 | Funada | F24F 12/006 165/104.34 |
| 2011/0285261 | A1 * | 11/2011 | Scheidler | H05K 7/20736 312/236 |
| 2012/0113590 | A1 * | 5/2012 | Schwiebert | H05K 7/20172 165/120 |
| 2012/0298341 | A1 * | 11/2012 | Fernandez | H05K 7/206 220/592.01 |
| 2015/0271950 | A1 * | 9/2015 | Hagiwara | H05K 7/206 174/547 |
| 2018/0245835 | A1 * | 8/2018 | Kamei | F25D 17/042 |
| 2019/0041071 | A1 * | 2/2019 | Cho | F24F 3/14 |
| 2019/0320555 | A1 * | 10/2019 | Flavin | H05K 7/20409 |
| 2020/0005592 | A1 * | 1/2020 | Wasinger | G07F 17/3216 |
| 2020/0390009 | A1 * | 12/2020 | Whitehead | G09F 9/3026 |

* cited by examiner

100

110

400

230

240

APPARATUS OF IMPROVING DURABILITY BASED ON DEHUMIDIFICATION DEVICE

TECHNICAL FIELD

The present disclosure relates to an apparatus of improving durability based on a dehumidification device, that is, an apparatus for protecting electric and electronic equipment. In more detail, the present disclosure relates to an apparatus for protecting electric and electronic equipment, the apparatus being able to prevent problems due to high-temperature heat that is generated by electric and electronic equipment, that is, being able to maintain the temperature of an interior sealed space, in which electric and electronic equipment is installed, and also remove humidity even though electric and electronic equipment is installed in an interior sealed space to protect them from the dust in the external air, raindrops, humidity, etc.

BACKGROUND ART

In various situations in which electric and electronic equipment has to be installed outside rather than inside due to various reasons, it is required to prevent humidity such as raindrops or foreign substances such as dust, which are fatal to the electric and electronic equipment or at least accelerate aging of the electric and electronic equipment, from entering the electric and electronic equipment.

It is the simplest solution to install electric and electronic equipment in a sealed structure, and in this case, it is possible to block humidity or dust, but there is a problem that it is difficult to smoothly handle the problem of heat that is generated by the electric and electronic equipment because a sealed structure is employed.

In relation to this matter, as a patent document in the related art, there is Korean Patent No. 10-1717619 (registered on Mar. 13, 2017, Title: DEHUMIDIFICATION APPARATUS). This patent document in the related art has disclosed "a general-purpose dehumidifier that applies a housing having a dehumidification member therein to a dehumidification target object (a lamp such as a street lamp or an automotive lamp, exterior or interior electronic boxes such as a distributor, communication equipment, security equipment, and a solar power system, etc.), removes interior humidity through an outer valve (closes the outer valve), which opens/closes an outside connection portion of the housing, when the dehumidification target object is at a high temperature, and opens the outer valve with an increase of the temperature in a lamp module such that the humidity of the dehumidification member can be discharged outside.

However, as in the present disclosure, an apparatus for protecting electric and electronic equipment that can prevent problems due to high-temperature heat that is generated by electric and electronic equipment, that is, can maintain the temperature of an interior sealed space, in which electric and electronic equipment is installed, and also remove humidity even though electric and electronic equipment is installed in an interior sealed space to protect them from the dust in the external air, raindrops, humidity, etc. was never disclosed.

PRIOR ART DOCUMENT (Patent Document 1) Korean Patent No. 10-1717619 (registered on Mar. 13, 2017, Title: DEHUMIDIFICATION APPARATUS)

DISCLOSURE

Technical Problem

The present disclosure has been made in an effort to solve the problems described above and an objective of the present disclosure is to provide an apparatus for protecting electric and electronic equipment that can prevent problems due to high-temperature heat that is generated by electric and electronic equipment, that is, can maintain the temperature of an interior sealed space, in which electric and electronic equipment is installed, and also remove humidity even though electric and electronic equipment is installed in an interior sealed space to protect them from the dust in the external air, raindrops, humidity, etc. was never stated.

Technical Solution

An apparatus for protecting electric and electronic equipment according to a preferred embodiment of the present disclosure for achieving the objective described above is an apparatus for protecting electric and electronic equipment that is used in an interior sealed space, in which electronic equipment is installed, to prevent the temperature of the interior sealed space from increasing higher than external air due to heat generated by the electronic equipment positioned therein and to prevent humidity from being produced in the interior sealed space, the apparatus including: a housing (100) disposed on a wall of the interior sealed space; an external air channel forming unit (200) that suctions external air, which has temperature lower than temperature of the interior sealed space, from a side of a lower portion of a first surface (110) of the housing using a first fan disposed at an upper portion of the housing, sends upward the external air, and discharges the external air to a side of an upper portion of the first surface of the housing; and an internal channel forming unit (300) that suctions internal air at a relatively high temperature in the interior closed space using a second fan and a third fan respectively disposed on a second surface (120) and a third surface (130) adjacent to the first surface of the housing such that the internal air suctioned through the second fan and the internal air suctioned through the third fan partially overlap the external air channel and hit against each other and the internal air descends and is then discharged from a lower portion of the second surface and a lower portion of the third surface of the housing.

In this configuration, the external air channel forming unit (200) includes: an external air intake vent (210) that suctions the external air through an external air inlet (211) formed at a side of the lower portion of the first surface of the housing; an external air intake bowl (220) that is coupled to the external air intake vent and is formed such that a center portion is relatively wide and an intake side and a discharge side are relative narrow to be able to generate swirls in flow of the external air; a plurality of inner pipes (230) that provides passages through which the external air rises; a protector pipe (240) that surrounds the plurality of inner pipes while turning; an external air discharge bowl (250) that is positioned over the plurality of inner pipes and the protector pipe and is formed such that a center portion is relatively wide and an intake side and a discharge side are relatively narrow to be able to generate swirls in flow of the external air; and an external air discharge vent (260) that is coupled to the external air discharge bowl and discharges the external air through an external air outlet (261) formed at a side of the upper portion of the first surface of the housing.

Further, it is preferable that a wrinkle structure is formed on inner surfaces of the external air intake bowl (220) and the external air discharge bowl (250) to better generate swirls in flow of the external air.

Further, it is preferable to further include bending structures (212, 262) on an external air channel in a direction facing first surfaces of the external air intake vent (210) and the external air discharge vent (260) so that raindrops or foreign substances are not directly suctioned from external air.

Further, it is preferable that the external air inlet (211) and the external air outlet (261) are alternately positioned to be biased to the left and right, respectively, with an up-down straight line of the first surface therebetween to be able to better generate swirls in flow of the external air.

Meanwhile, the apparatus for protecting electric and electronic equipment is a dehumidifier (400) that maintains humidity of the interior sealed space by removing humidity of the internal sealed space.

Further, the humidifier (400) includes: a porous anode (410) positioned to face the interior sealed space; a porous cathode (420) positioned to face the external air; a power unit applying DC voltage to the porous anode and the porous cathode; and polymer electrolyte membrane (430) is a component disposed between the porous anode and the porous cathode.

In this configuration, a dehumidifying reaction of $H_2O \rightarrow 2H^+ + {}^{1/2}O_2 + 2e^-$ occurs at the porous anode 410 described above and a damp-proofing reaction of $2H^+ + {}^{1/2}O_2 + 2e^- \rightarrow H_2O$ occurs at the porous cathode 420, so dehumidifying and damp-proofing are respectively performed, and as a result, the internal sealed space is dehumidified and constant humidity can be maintained.

Further, it is preferable that the dehumidifier is formed at the lower portion of the housing or on the first surface close to the lower portion to be able to remove humidity that is produced by cooling of the internal air.

Advantageous Effects

The apparatus for protecting electric and electronic equipment according to a preferred embodiment of the present disclosure can control the temperature and humidity of an interior sealed space to be maintained at a predetermined level and can maintain the temperature of internal air of the interior sealed space at a level the same or slightly higher than the temperature of external air at a relatively low temperature. That is, internal air suctioned through the second fan (310 and internal air suctioned through the third fan (32) partially overlap an external air channel and exchange heat well while hitting against each other between the protector pipe (240) and the plurality of inner pipes (230). Further, it is possible to enable high-temperature internal air to stay longer in the housing through the housing and it is possible to increase heat exchange efficiency by additionally installing fins of various shapes on the outer surfaces of the plurality of inner pipes. Further, it is possible to efficiently dehumidify the internal sealed space.

BEST MODE FOR INVENTION

Hereinafter, preferred embodiments of the present disclosure will be described with reference to accompanying drawings. The terms and words used in the present specification and claims should not be interpreted as being limited to typical meanings or dictionary definitions, but should be interpreted as having meanings and concepts relevant to the technical scope of the present disclosure based on the rule according to which an inventor can appropriately define the concept of the term to describe most appropriately the best method he or she knows for carrying out the invention.

Therefore, the configurations described in the embodiments and drawings of the present disclosure are merely most preferable embodiments but do not represent all of the technical spirit of the present invention. Thus, it should be understood that the present disclosure should be construed as including all the changes, equivalents, and substitutions included in the spirit and scope of the present disclosure at the time of filing this application.

Figure 1:
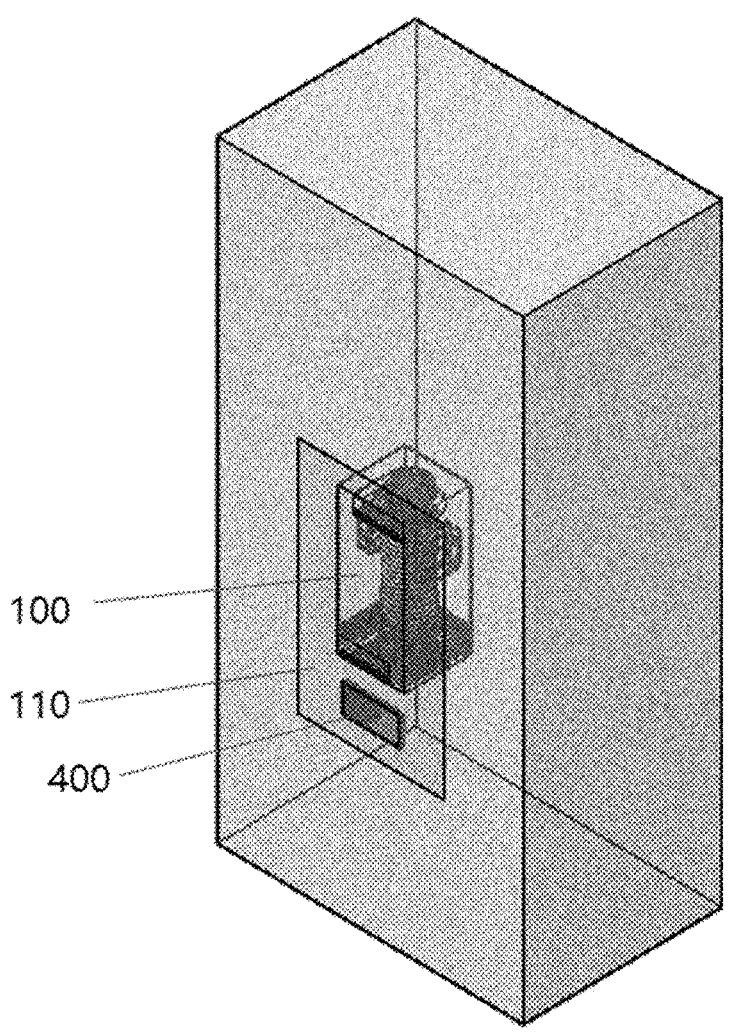
FIG. 1 is a projective perspective view showing the state in which an apparatus for protecting electric and electronic equipment according to a preferred embodiment of the present disclosure has been installed in an interior sealed space.
Figure 2:
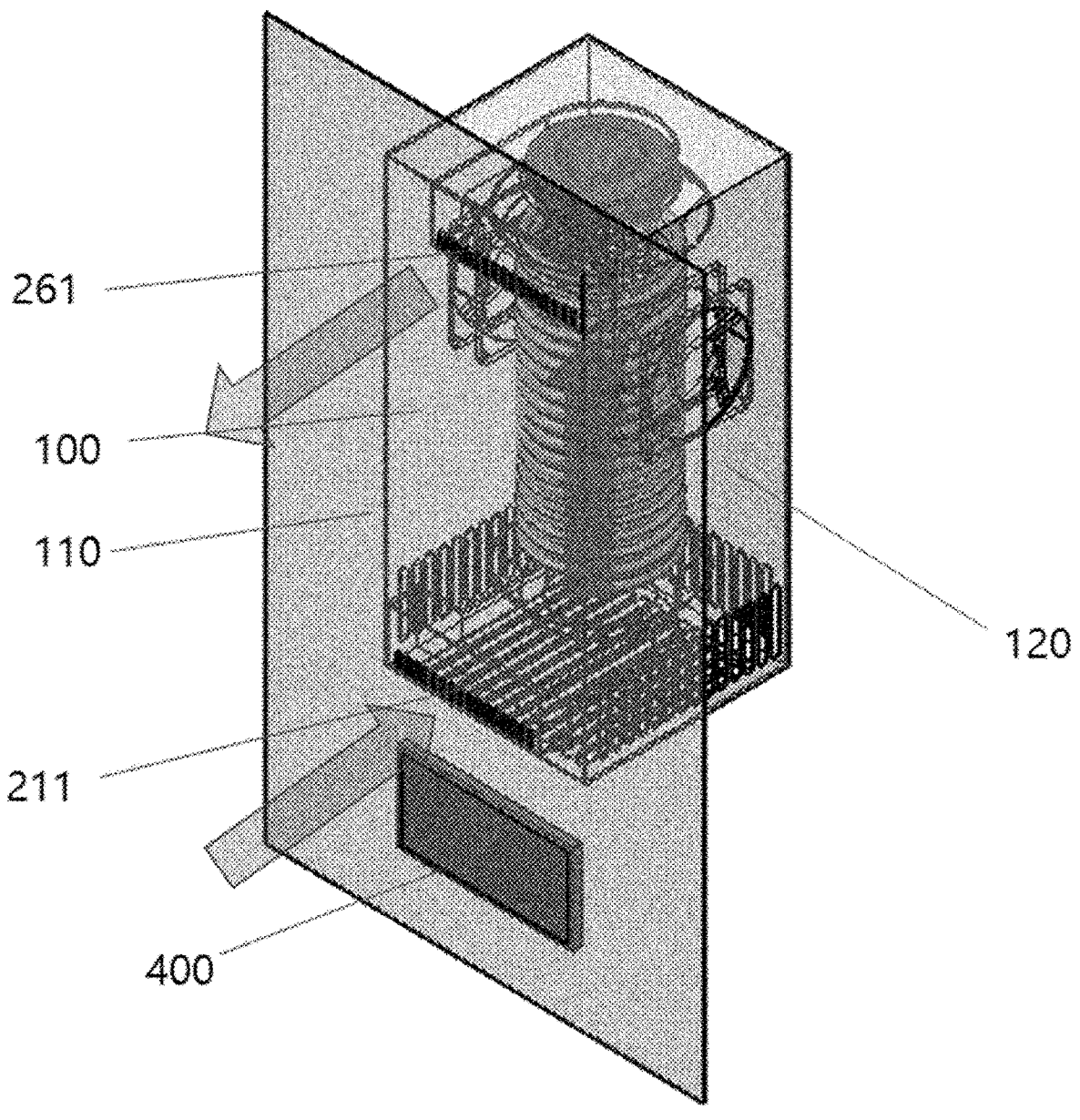
FIG. 2 shows only the apparatus for protecting electric and electronic equipment with the interior sealed space of FIG. 1 removed, in which showing flow with blue shows external air channels.
Figure 3:
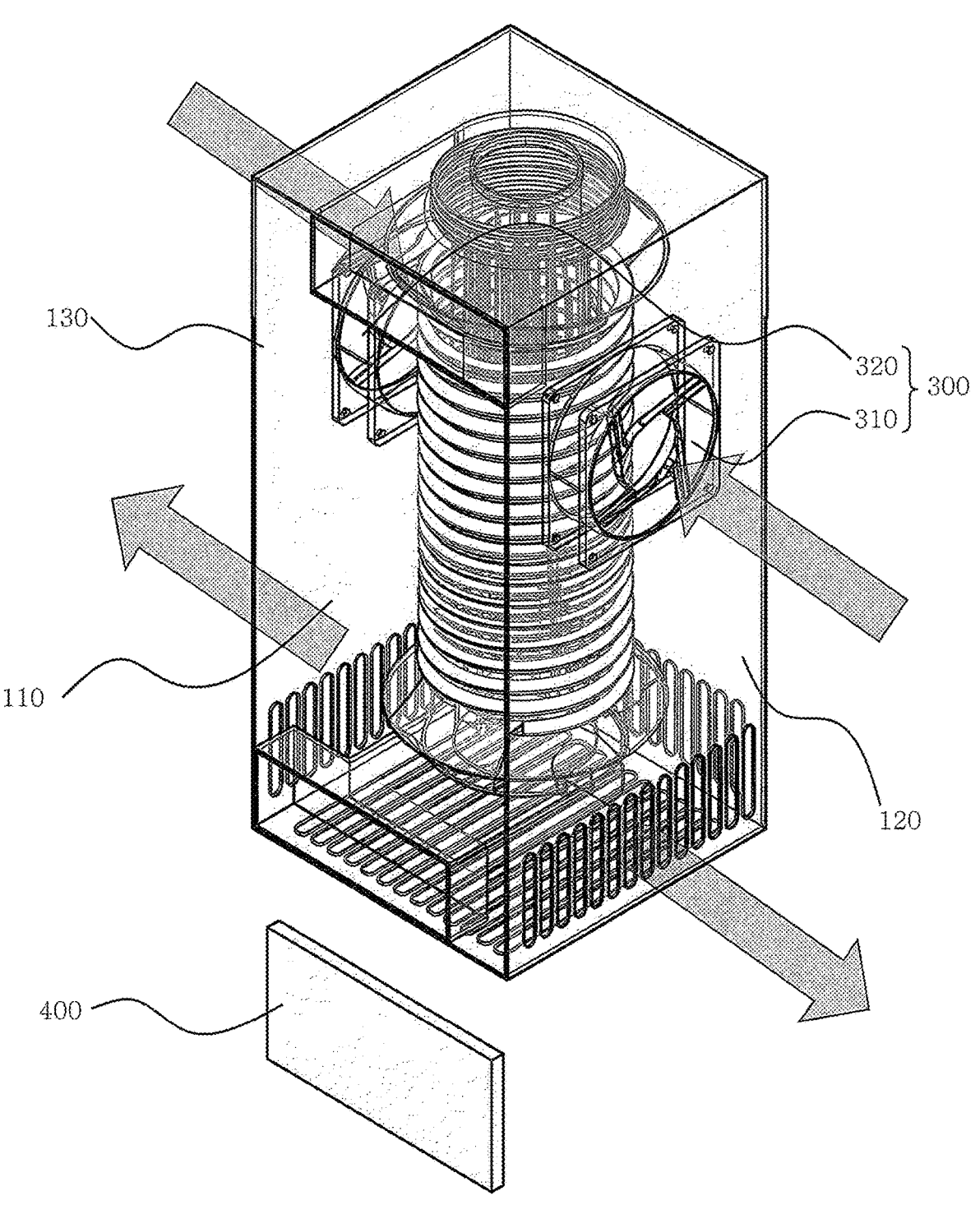
FIG. 3 shows that of FIG. 2 with the wall of the interior sealed space removed, in which showing flow with red shows collision with internal air channels, etc.
Figure 4:
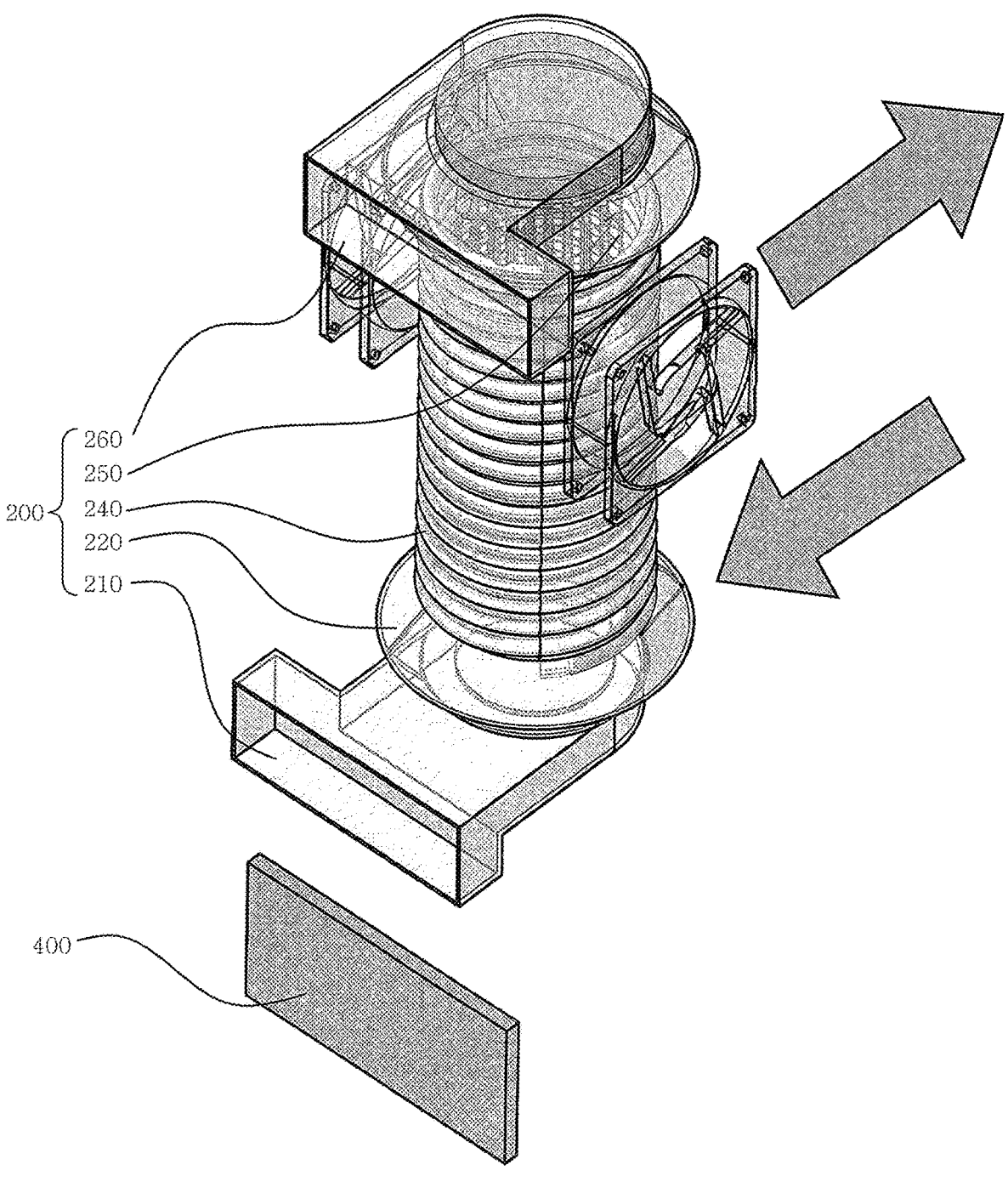
FIG. 4 is a perspective view showing that of FIG. 3 with a housing 100 removed.
Figure 5:
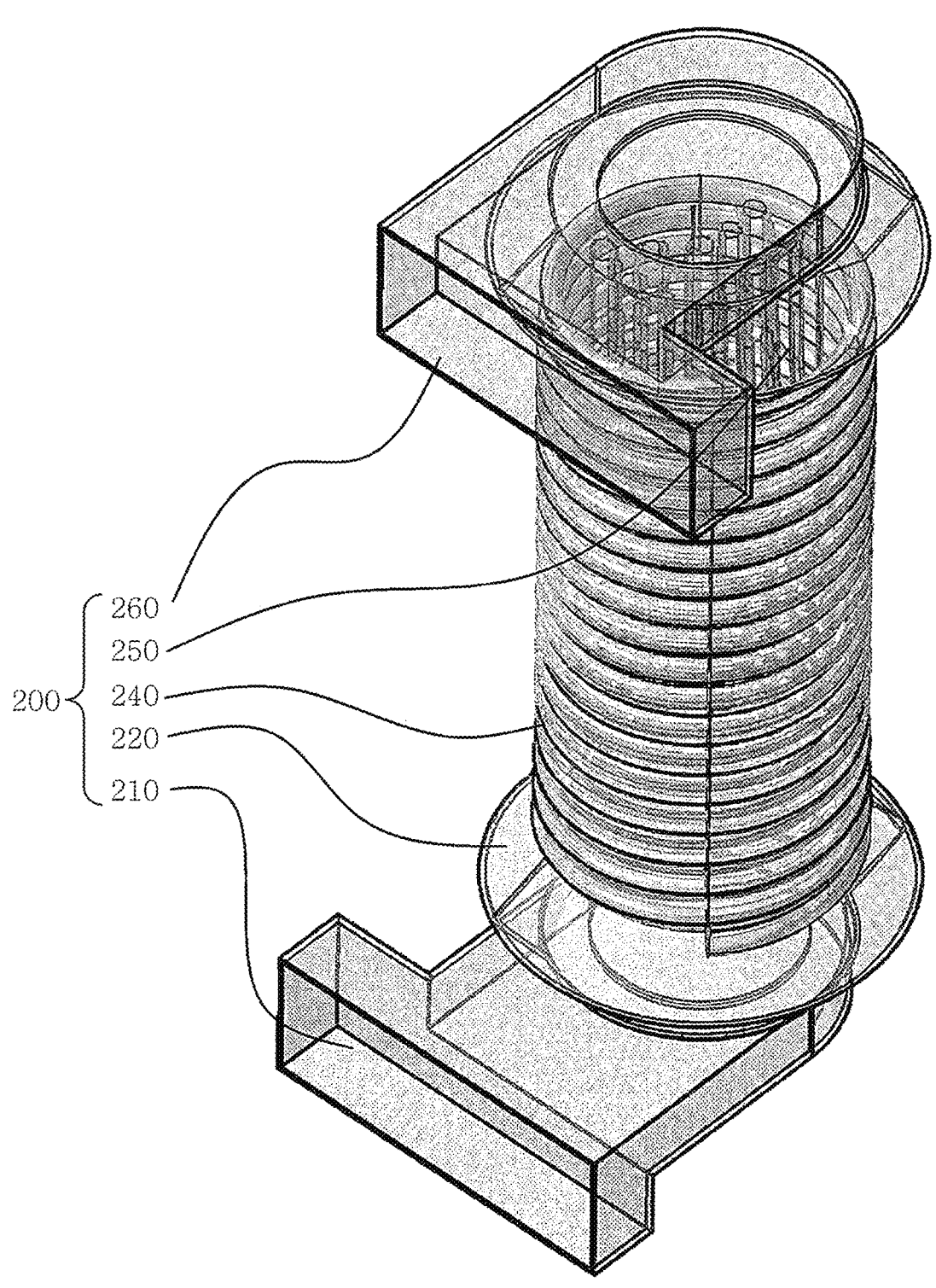
FIG. 5 is a perspective view showing that of FIG. 4 with a dehumidifier 400 removed.
Figure 6:
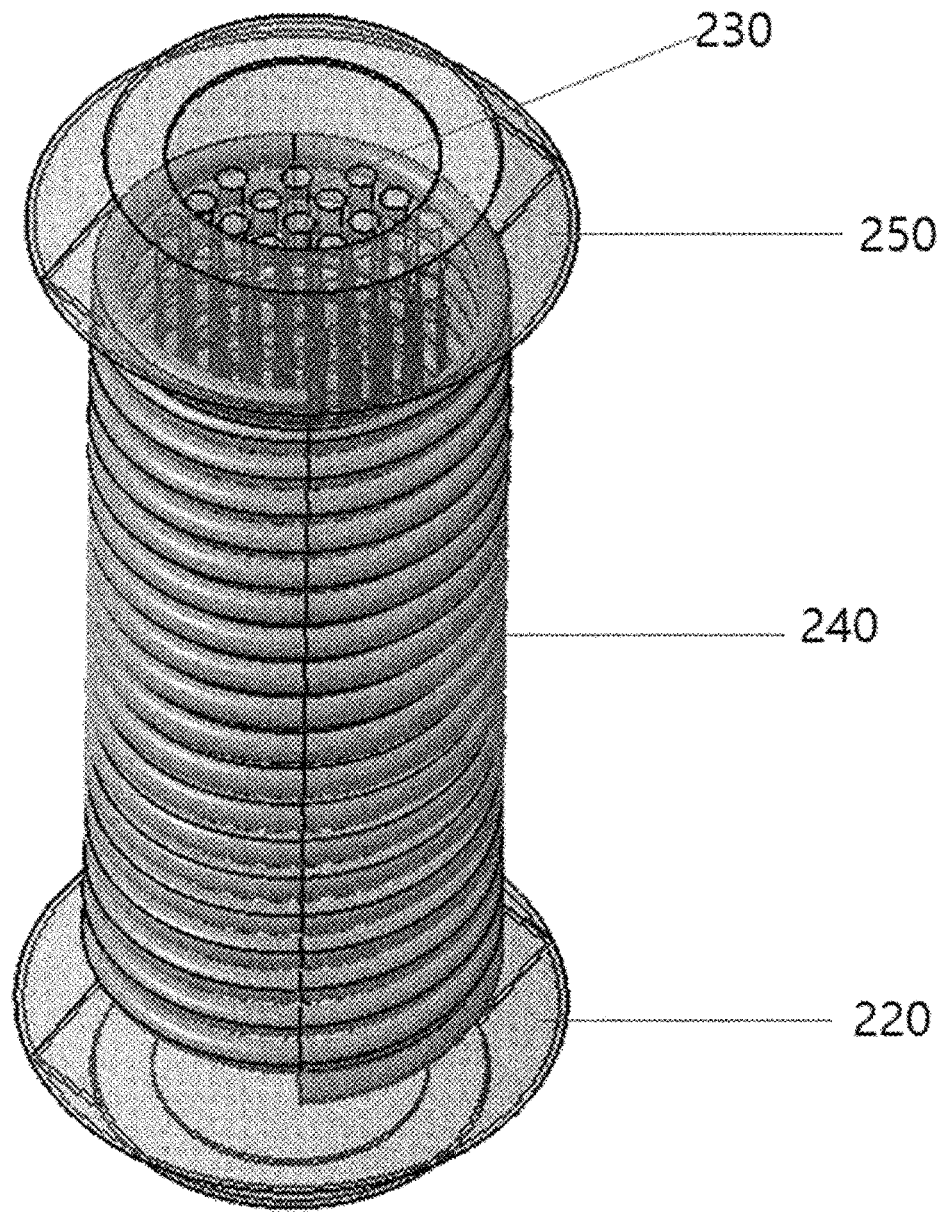
FIG. 6 shows only an external air intake bowl 220, a plurality of inner pipes 230, a protector pipe 240, and an external air discharge bowl 250.
Figure 7:
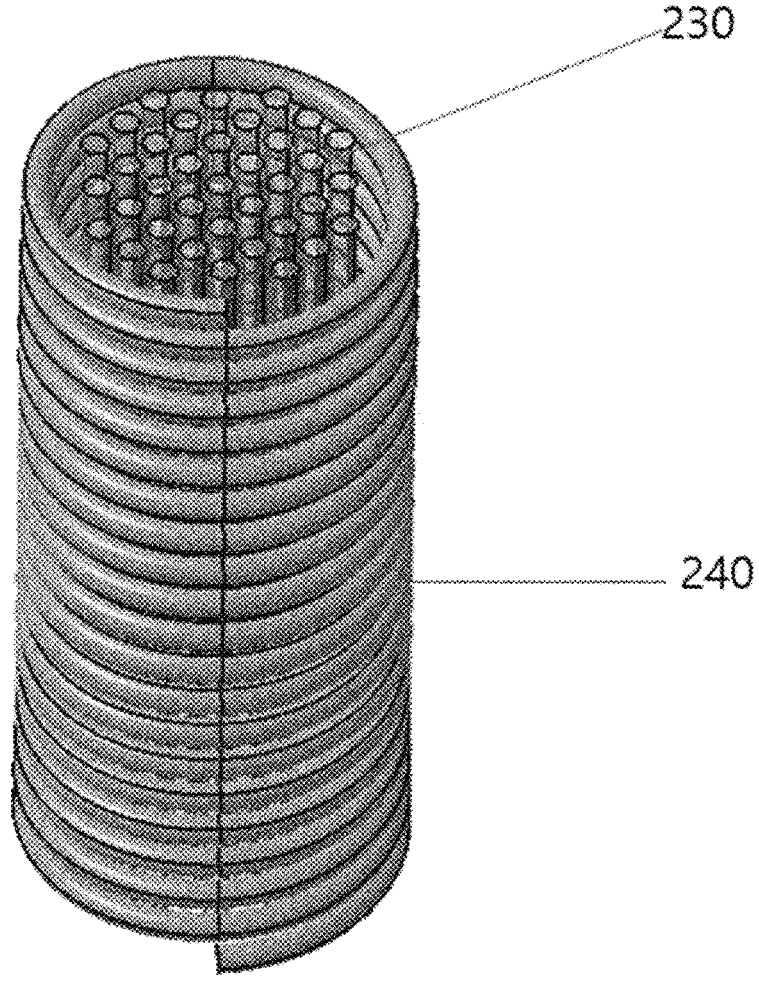
FIG. 7 shows the plurality of inner pipes 230 and the protector pipe 240.
Figure 8:
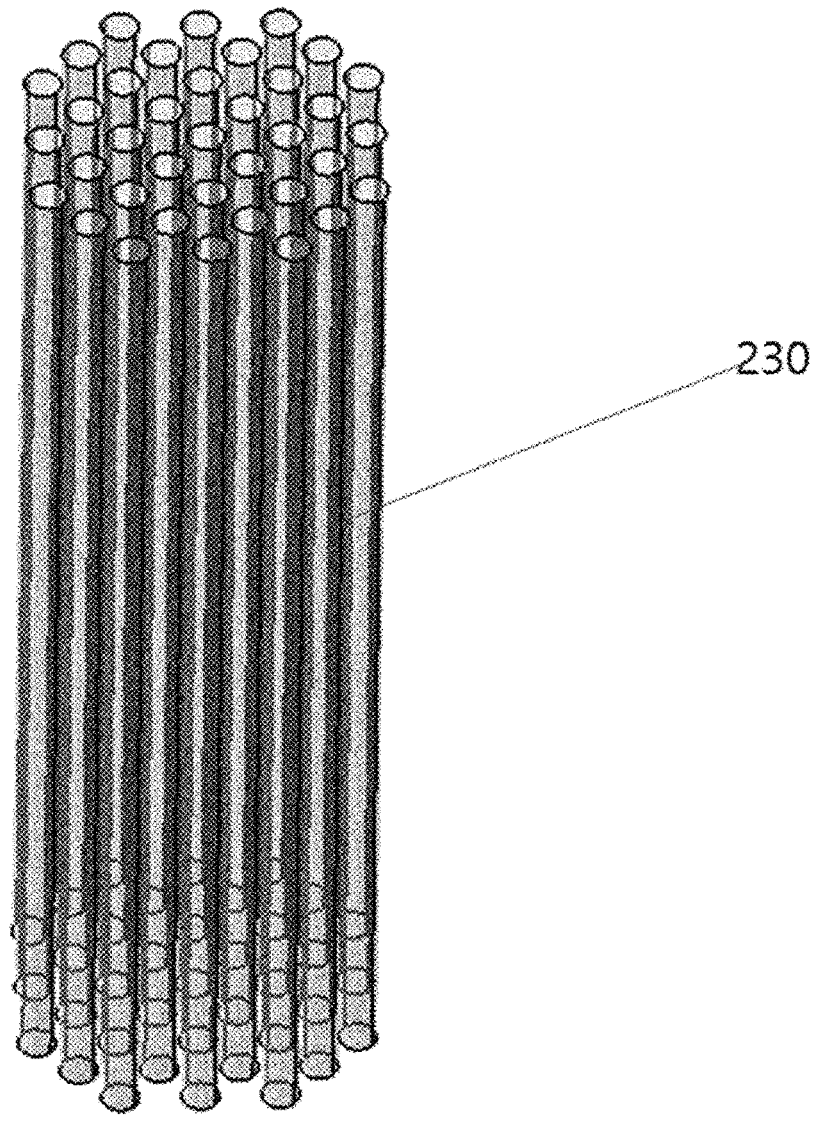
FIG. 8 shows only the plurality of inner pipes 230.
Figure 9:
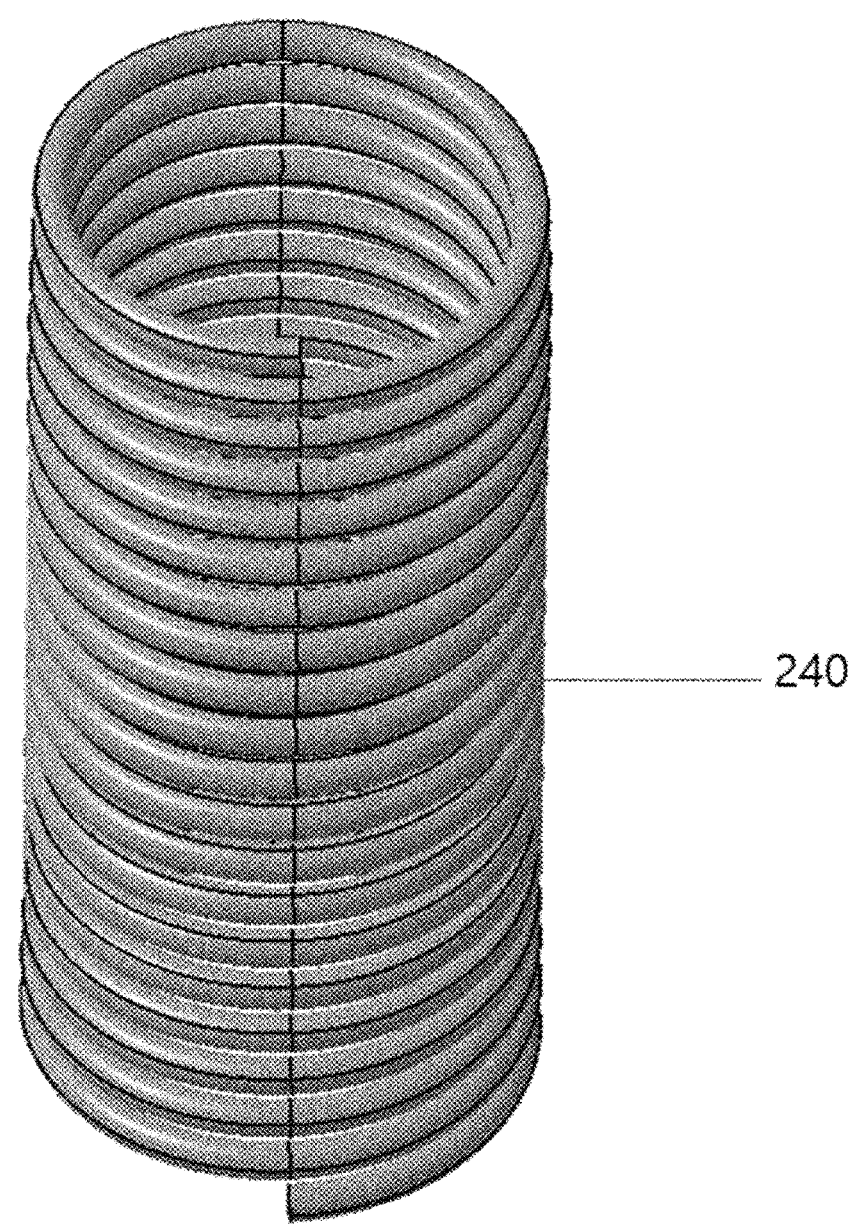
FIG. 9 shows only the protector pipe 240.

FIG. 1 is a projective perspective view showing the state in which an apparatus for protecting electric and electronic equipment according to a preferred embodiment of the present disclosure has been installed in an interior sealed space, FIG. 2 shows only the apparatus for protecting electric and electronic equipment with the interior sealed space of FIG. 1 removed, in which showing flow with blue shows external air channels, and FIG. 3 shows that of FIG. 2 with the wall of the interior sealed space removed, in which showing flow with red shows collision with internal air channels, etc.

As shown in FIGS. 1 to 4, an apparatus for protecting electric and electronic equipment according to a preferred embodiment of the present disclosure relates to an apparatus for protecting electric and electronic equipment that is used in an interior sealed space, in which electronic equipment is installed, to prevent the temperature of the interior sealed space from increasing higher than external air due to heat generated by the electronic equipment positioned therein and to prevent humidity from being produced in the interior sealed space.

The apparatus for protecting electric and electronic equipment according to a preferred embodiment of the present disclosure includes a housing 100, an external air channel forming unit 200, and an internal channel forming unit 300. In this configuration, the housing 100 is a component disposed on a wall of an interior sealed space in which electric and electronic equipment is installed.

Figure 12:
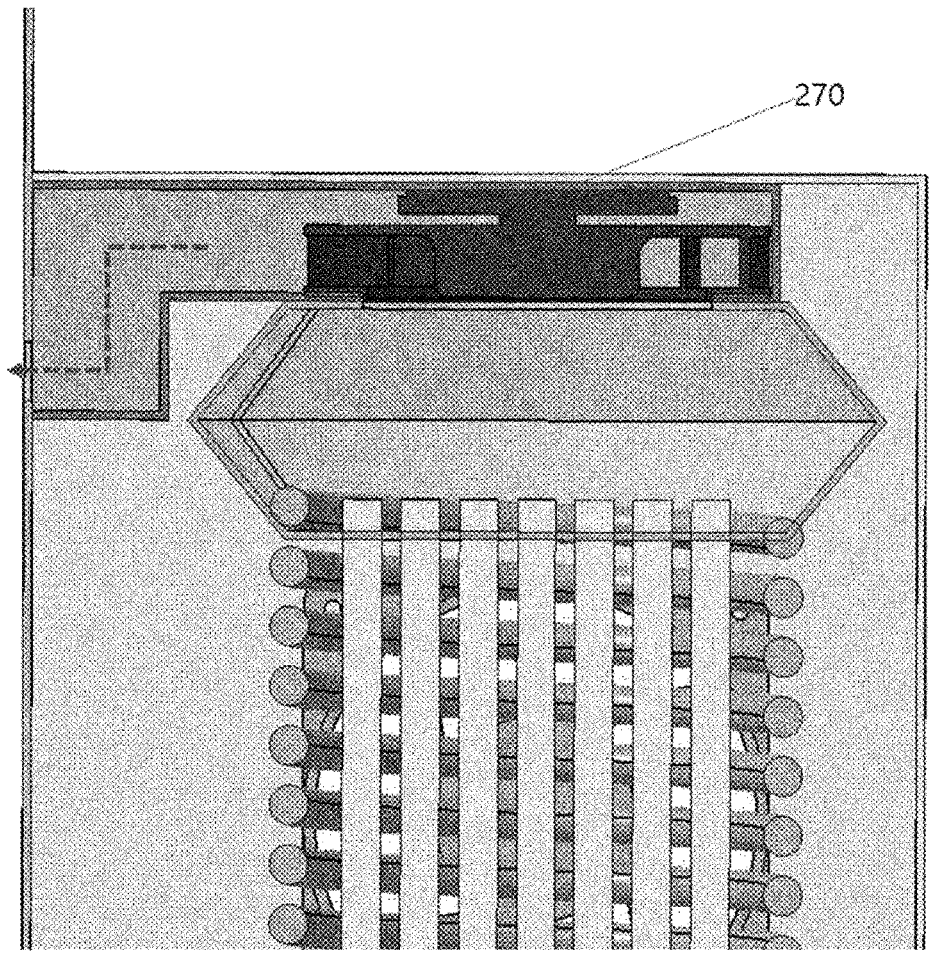
FIG. 12 is a vertical cross-sectional view showing only the upper portion of that of FIG. 10.
Figure 13:
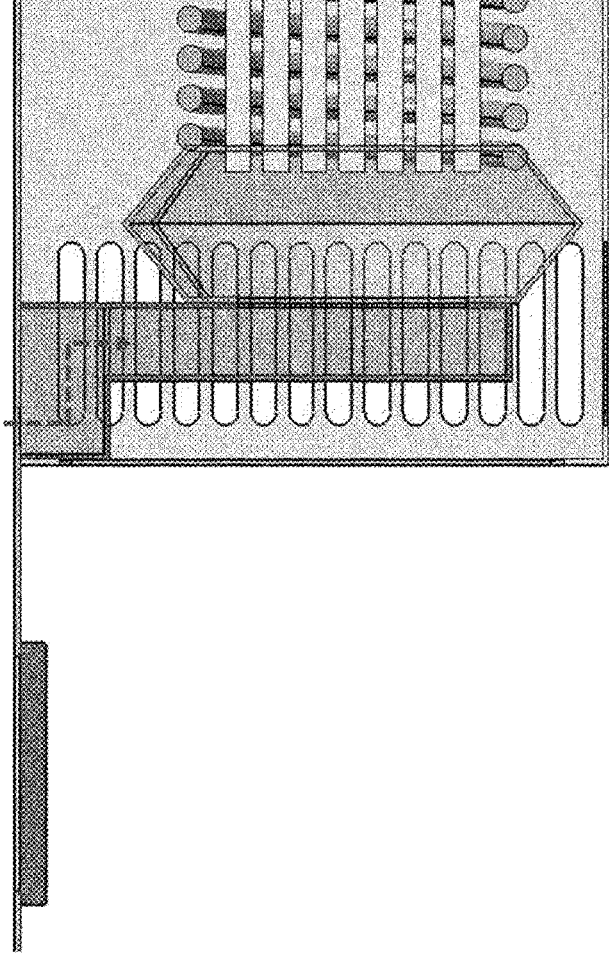
FIG. 13 is a vertical cross-sectional view showing only the lower portion of that of FIG. 10.

Next, the external air channel forming unit 200 is a component that suctions external air, which has temperature lower than the temperature of the interior sealed space, from a side of the lower portion of a first surface 110 of the housing 100 using a first fan 270 (see FIG. 12) disposed at the upper portion of the housing 100 described above, sends upward the external air, and discharges the external air to a side of the upper portion of the first surface 110 of the housing 100.

The external air channel forming unit 200 includes an external air intake vent 210, an external air intake bowl 220, a plurality of inner pipes 230, a protector pipe 240, an external air discharge bowl 250, an external air discharge vent 260, and a first fan 270.

First, the external air intake vent 210, as shown in FIG. 2, suctions external air lower in temperature than internal air through an external air inlet 211 formed at a side of the lower portion of the first surface 110 of the housing 100. In this configuration, the external air inlet 211, as shown in FIG. 2, may be composed of a plurality of oblong holes elongated up and down. Accordingly, it is possible to effectively prevent entering of water or humidity such as raindrops, and foreign substances. An anti-foreign substance entrance filter may be additionally installed, but it is preferable to select the filter under the assumption that it is not limited by flow of external air.

Figure 10:
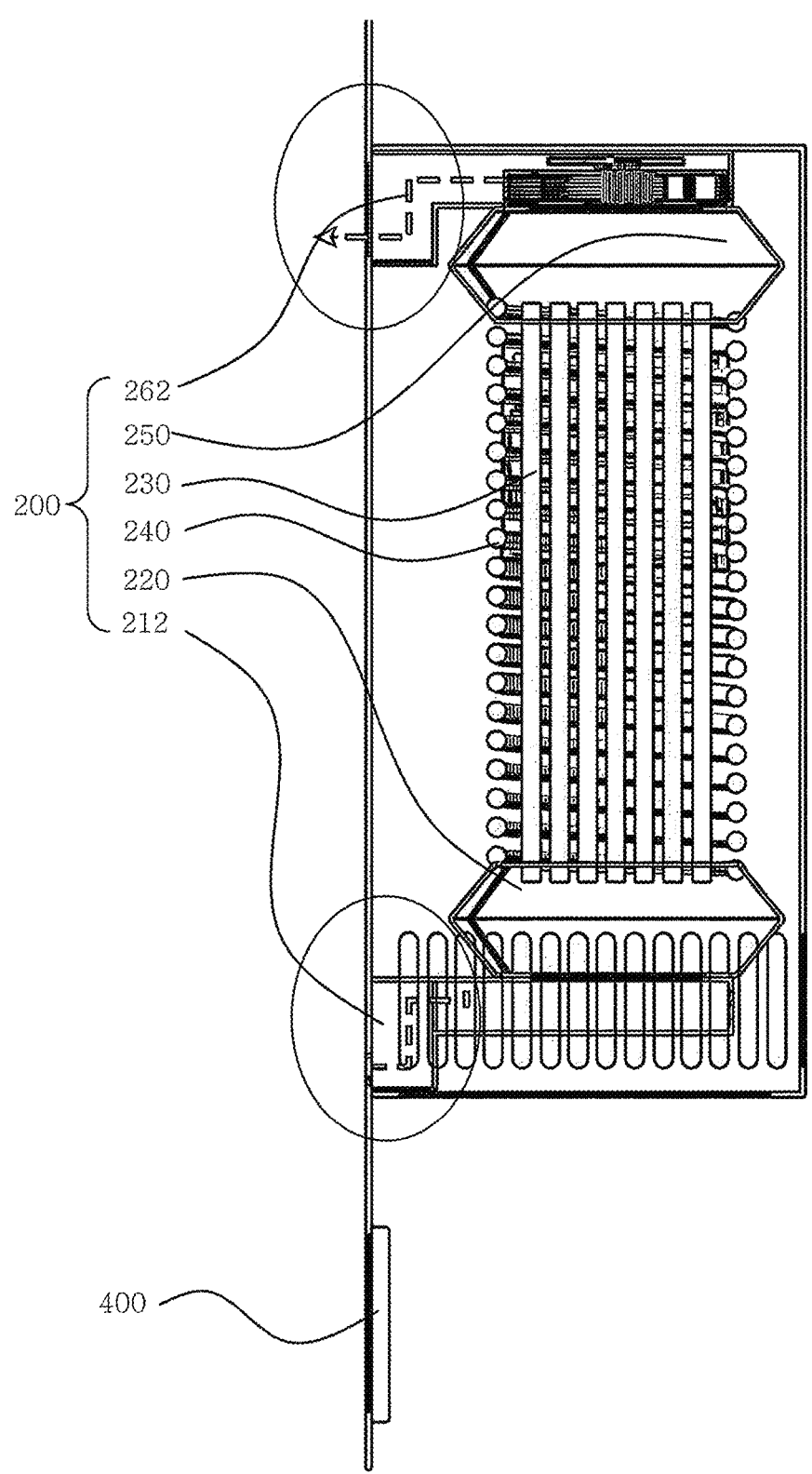
FIG. 10 is a vertical cross-sectional view of the apparatus for protecting electric and electronic equipment according to a preferred embodiment of the present disclosure, in which red dotted lines show bending of external air flow.
Figure 11:
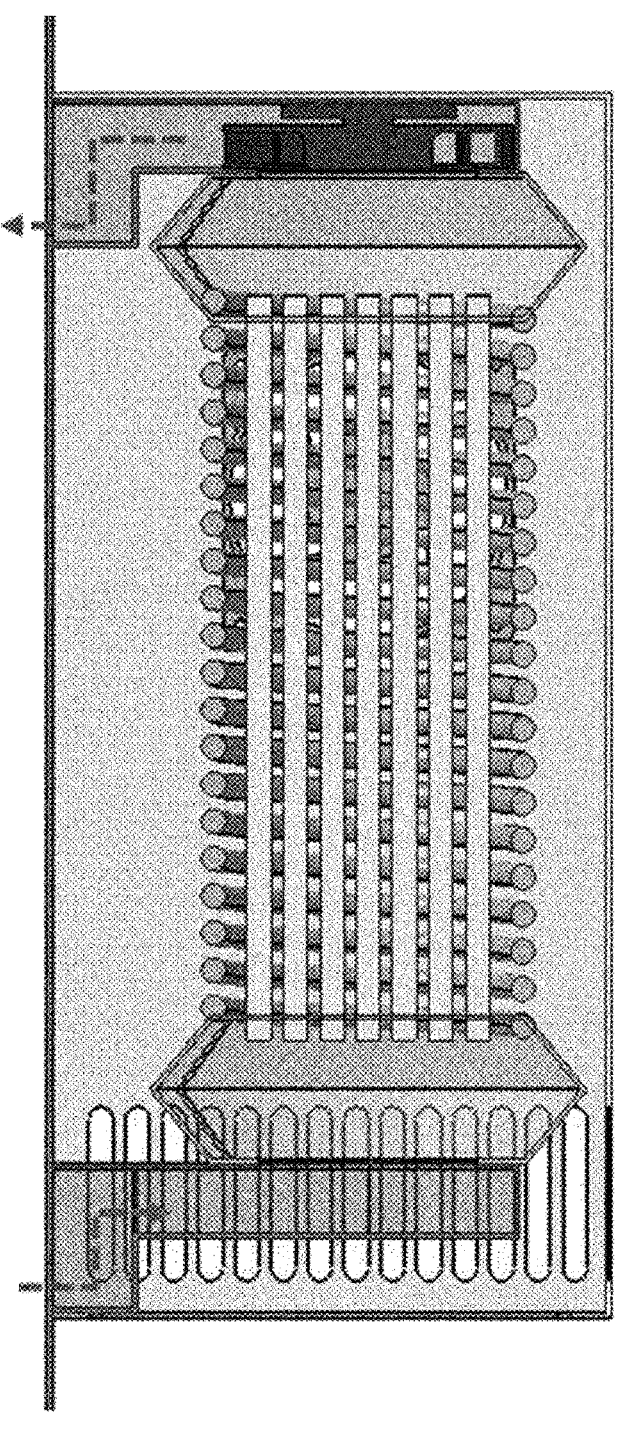
FIG. 11 is a vertical cross-sectional view showing that of FIG. 10 with the dehumidifier 400 removed.

Next, the external air intake bowl 220 is coupled to the external air intake vent 210 and is formed such that the center portion is relatively wide and the intake side and the discharge side are relative narrow, as shown in FIG. 10, etc., to be able to generate swirls in flow of external air. Further, though not shown, a wrinkle structure is formed on the inner surface of the external air intake bowl 220, thereby being able to induce the external air intake bowl 220 to better generate swirls in flow of external air. Since swirls are induced in this way, high-temperature internal air and swirling external air come in contact with each other, so the possibility or probability of heat exchange increases.

Next, a plurality of inner pipes 230 elongated up and down, having a hole, and providing passages or paths through which external air, which has passed through the external air intake vent 210 and the external air intake bowl 220, rises is further included. Low-temperature external air at the lower portion rises through the inner pipes 230. The plurality of inner pipes 230 is also a section in which high-temperature internal air meets each other and exchanges heat. A fin structures of various shape or forms may be further included on the outer surface of a necessary plurality of inner pipes 230.

Next, the protector pipe 240 is a component surrounding the plurality of inner pipes 230 while turning. By providing the protector pipe 240, there is an effect that a space is partially confined such that the channels of internal air and external air overlap each other in the spaces between the inner pipes 230 and heat exchange can be generated while they collide with each other.

Next, the external air discharge bowl 250 is positioned over the plurality of inner pipes 230 and the protector pipe 240 described above and is formed such that the center portion is relatively wide and the intake side and the discharge side are relatively narrow to be able to generate swirls in the flow of external air described above. Further, if necessary, as described above with the external air intake bowl 220, a wrinkle structure is formed on the inner surface of the external air discharge bowl 250, thereby being able to induce the external air discharge bowl 250 to better generate swirls in the flow of external air.

Next, the external air discharge vent 260 is coupled to the external air discharge bowl 250 and discharges the external air through an external air outlet 261 formed at a side of the upper portion of the first surface 110 of the housing 100. As shown in FIG. 2, the external air discharge vent 260, similar to the external air inlet 211, may be composed of a plurality of oblong holes elongated up and down. Accordingly, it is possible to effectively prevent entering of water or humidity such as raindrops, and foreign substances.

As shown in FIGS. 10 to 13, bending structures 212 and 262 may be further included on the external air channel in the direction facing first surfaces of the external air intake vent 210 and the external air discharge vent 260 so that raindrops or foreign substances are not directly suctioned from the external air. As shown in FIGS. 10 to 13, the bending structures on the external air channel are indicated by red dotted lines.

Further, as shown in FIG. 2, the external air inlet 211 and the external air outlet 261 may be alternately positioned to be biased to the left and right, respectively, with an up-down straight line of the first surface therebetween to be able to better generate swirls in flow of external air. That is, it can be seen that, in FIG. 2, the external air inlet 211 is biased to the left from the up-down straight line and the position of the external air outlet 261 is biased to the right from the up-down straight line.

Next, the internal channel forming unit 300 suctions internal air at a relatively high temperature in the interior closed space using a second fan 310 and a third fan 320 respectively disposed on a second surface 120 and a third surface 130 adjacent to the first surface 110 of the housing 100 described above, so the internal air suctioned through the second fan 310 and the internal air suctioned through the third fan 320 partially overlap the external air channel, and as described above, exchange heat with each other while colliding with each other between the protector pipe 240 and the plurality of inner pipes 230. The high-temperature internal air is cooled and descends by the external air at a relatively low temperature and then discharged from the lower portions of the second surface 120 and the third surface 130 of the housing 100. Internal air outlets are formed not only on the lower second surface 120 and third surface 130 of the housing, but a fourth surface (surface opposite to the first surface.

When maintaining temperature and humidity through an electric and electronic protection device, it is preferable to perform feedback control to desired temperature and humidity, for example, PID control using a temperature sensor and a humidity sensor. Further, it is also possible to find out a pattern by accumulating sensing result values of the temperature sensor and the humidity sensor as data, learning the data, and using, for example, CNN that is a deep learning algorithm, etc. Further, it is also possible to estimate in advance the temperature and humidity of the interior sealed space through a Kalman filter, an extended Kalman filter, or the like.

Next, describing the humidifier 400, the humidifier 400 includes a porous anode 410, a porous cathode 420, a power unit 440, and polymer electrolyte membrane 430. The porous anode 410 is positioned to face the interior sealed space, and in contrast, the porous cathode 420 is positioned to face external air. The power unit 410 applies DC voltage, usually, DC voltage of about 3V to the porous anode 410 and the porous cathode 420. The polymer electrolyte membrane 430 is a component disposed between the porous anode 410 and the porous cathode 420.

In this configuration, the porous anode 410 and the porous cathode 420 need to enable air to smoothly flow while uniformly supplying power to the polymer electrolyte membrane 430. Accordingly, it is required to make the anode 410 and the cathode 420 using a porous material or form holes by performing treatment to an implemented material.

For example, it is possible to use a porous carbon material that is excellent in terms of electron mobility and in which air holes at the level of hundreds of nanometers or several micrometers are easily formed. Further, the anode 410 and the cathode 420 support the polymer electrolyte membrane 430, thereby simultaneously serving to prevent problems such as twisting or bending of the polymer electrolyte membrane 430. Further, a resin material, etc. may be further included to insulating the entire dehumidifier 400.

According to this configuration, a dehumidifying reaction of $H_2O \rightarrow 2H^+ + \frac{1}{2}O_2 + 2e^-$ occurs at the porous anode 410 described above and a damp-proofing reaction of $2H^+ + \frac{1}{2}O_2 + 2e^- \rightarrow H_2O$ occurs at the porous cathode 420, so dehumidifying and damp-proofing are respectively performed. Water is dissolved into hydrogen positive ions and oxygen by losing electrons in the interior sealed space and, as for external air, hydrogen positive ions moving to the cathode 420 through the polymer electrolyte membrane 430 bond to oxygen in external air, that is, the atmosphere, thereby being discharged as vapor. As a result, dehumidification is generated in the interior sealed space.

Further, it is preferable that the dehumidifier 400 is formed at the lower portion of the housing 100 or on the first surface 110 close to the lower portion to be able to humidity, etc. which have high possibility of being produced when high-temperature internal air is cooled by low-temperature external air.

Although the present disclosure was described with reference to limited exemplary embodiments and drawings, the present disclosure is not limited thereto and may be changed and modified in various ways within the spirit of the present disclosure and claims described below by those skilled in the art.

DESCRIPTION OF REFERENCE NUMERALS

100 . . . housing
110 . . . first surface
120 . . . second surface
130 . . . third surface
200 . . . external air channel forming unit
210 . . . external air intake vent
211 . . . external air inlet
212 . . . bending structure on external air channel
220 . . . external air intake bowl
230 . . . plurality of inner pipes
240 . . . a protector pipe
250 . . . external air discharge bowl
260 . . . external air discharge vent
261 . . . external air outlet
262 . . . bending structure on external air channel

270 . . . first fan
300 . . . internal channel forming unit
310 . . . second fan
320 . . . third fan
400 . . . dehumidifier
410 . . . porous anode
420 . . . porous cathode
430 . . . polymer electrolyte membrane
440 . . . power unit

The invention claimed is:

1. An apparatus for protecting electric and electronic equipment that is used in an interior sealed space, in which electronic equipment is installed, to prevent the temperature of the interior sealed space from increasing higher than external air due to heat generated by the electronic equipment positioned therein and to prevent humidity from being produced in the interior sealed space, the apparatus comprising:

a housing that is disposed on a wall of the interior sealed space;

an external air channel forming unit that suctions external air, which has temperature lower than temperature of the interior sealed space, from a side of a lower portion of a first surface of the housing using a first fan disposed at an upper portion of the housing, sends upward the external air, and discharges the external air to a side of an upper portion of the first surface of the housing; and an internal channel forming unit that suctions internal air at a relatively high temperature in the interior closed space using a second fan and a third fan respectively disposed on a second surface and a third surface adjacent to the first surface of the housing such that the internal air suctioned through the second fan and the internal air suctioned through the third fan partially overlap the external air channel and hit against each other and the internal air descends and is then discharged from a lower portion of the second surface and a lower portion of the third surface of the housing.

2. The apparatus of claim 1, wherein the external air channel forming unit includes:

an external air intake vent that suctions the external air through an external air inlet formed at a side of the lower portion of the first surface of the housing;

an external air intake bowl that is coupled to the external air intake vent and is formed such that a center portion is relatively wide and an intake side and a discharge side are relative narrow to be able to generate swirls in flow of the external air;

a plurality of inner pipes that provides passages through which the external air rises;

a protector pipe that surrounds the plurality of inner pipes while turning;

an external air discharge bowl that is positioned over the plurality of inner pipes and the protector pipe and is formed such that a center portion is relatively wide and an intake side and a discharge side are relatively narrow to be able to generate swirls in flow of the external air; and an external air discharge vent that is coupled to the external air discharge bowl and discharges the external air through an external air outlet formed at a side of the upper portion of the first surface of the housing.

3. The apparatus of claim 2, wherein a wrinkle structure is formed on inner surfaces of the external air intake bowl and the external air discharge bowl to better generate swirls in flow of the external air.

4. The apparatus of claim 2, further comprising bending structures on an external air channel in a direction facing first surfaces of the external air intake vent and the external air discharge vent so that raindrops or foreign substances are not directly suctioned from external air.

5. The apparatus of claim 2, wherein the external air inlet and the external air outlet are alternately positioned to be biased to the left and right, respectively, with an up-down straight line of the first surface therebetween to be able to better generate swirls in flow of the external air.

\* \* \* \* \*